(12) United States Patent
Zhao et al.

(10) Patent No.: US 11,233,101 B2
(45) Date of Patent: Jan. 25, 2022

(54) DISPLAY SUBSTRATE, DISPLAY DEVICE, AND MANUFACTURING METHOD OF DISPLAY SUBSTRATE

(71) Applicant: BOE TECHNOLOGY GROUP CO., LTD., Beijing (CN)

(72) Inventors: Dejiang Zhao, Beijing (CN); Yang Yang, Beijing (CN); Xiaojie Pan, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 278 days.

(21) Appl. No.: 16/334,644

(22) PCT Filed: May 31, 2018

(86) PCT No.: PCT/CN2018/089223
§ 371 (c)(1),
(2) Date: Mar. 19, 2019

(87) PCT Pub. No.: WO2019/052229
PCT Pub. Date: Mar. 21, 2019

(65) Prior Publication Data
US 2021/0028253 A1 Jan. 28, 2021

(30) Foreign Application Priority Data
Sep. 18, 2017 (CN) .......................... 201710842233.X

(51) Int. Cl.
*H01L 27/32* (2006.01)
*H01L 51/56* (2006.01)
(52) U.S. Cl.
CPC ...... *H01L 27/3246* (2013.01); *H01L 27/3283* (2013.01); *H01L 51/56* (2013.01)

(58) Field of Classification Search
CPC ............. H01L 27/3246; H01L 27/3218; H01L 27/3216; H01L 27/3211; H01L 27/3283; H01L 27/326; H01L 27/3262
See application file for complete search history.

(56) References Cited

U.S. PATENT DOCUMENTS 7,459,322 B2 12/2008 Ito et al.
7,764,013 B2 7/2010 Lee et al.
(Continued)

FOREIGN PATENT DOCUMENTS

CN 1893106 A 1/2007
CN 101488519 A 7/2009
(Continued)

OTHER PUBLICATIONS

Chinese Office Action dated Jun. 18, 2019, from application No. 201710842233.X.
(Continued)

*Primary Examiner* — Jaehwan Oh
(74) *Attorney, Agent, or Firm* — Arch & Lake LLP

(57) ABSTRACT

The present disclosure provides a display substrate, a display device, and a method manufacturing of a display substrate, pertaining to the field of display devices. The display substrate includes a base substrate and a pixel defining layer. The pixel defining layer divides the base substrate into a plurality of sub-pixel regions. An orthographic projection of the at least one sub-pixel region on the base substrate is substantially quadrangular. The first side and the third side of the quadrilateral are inwardly recessed toward each other.

17 Claims, 10 Drawing Sheets

(56) References Cited

U.S. PATENT DOCUMENTS

| | | | |
|---|---|---|---|
| 8,059,234 B2* | 11/2011 | Tsao | G02F 1/133516 |
| | | | 349/106 |
| 10,396,130 B2* | 8/2019 | Cao | H01L 27/3246 |
| 2004/0009303 A1* | 1/2004 | Ito | H01L 27/3246 |
| | | | 313/483 |
| 2005/0116632 A1 | 6/2005 | Funamoto | |
| 2007/0035242 A1* | 2/2007 | Lee | H01L 27/3246 |
| | | | 313/506 |
| 2008/0231778 A1 | 9/2008 | Tsao | |
| 2009/0068351 A1 | 3/2009 | Ito et al. | |
| 2015/0123102 A1 | 5/2015 | Jeon | |
| 2019/0181196 A1* | 6/2019 | Dai | H01L 27/3246 |
| 2020/0075690 A1* | 3/2020 | Li | H01L 27/3213 |
| 2020/0212124 A1* | 7/2020 | Shao | H01L 27/3246 |
| 2020/0335576 A1* | 10/2020 | An | H01L 51/5275 |

FOREIGN PATENT DOCUMENTS

| | | |
|---|---|---|
| CN | 107425045 A | 12/2017 |
| CN | 207149561 U | 3/2018 |
| EP | 2797115 A2 | 10/2014 |
| JP | 2007-103032 A | 4/2007 |
| JP | 2009064745 A | 3/2009 |

OTHER PUBLICATIONS

International Search Report and Written Opinion dated Aug. 13, 2018, from application No. PCT/CN2018/089223.
European Extended Search Report issued in EP18845430.0, dated Jul. 21, 2021, 8 pages.

* cited by examiner

DISPLAY SUBSTRATE, DISPLAY DEVICE, AND MANUFACTURING METHOD OF DISPLAY SUBSTRATE

CROSS REFERENCE

The present application is based upon International Application No. PCT/CN2018/089223, filed on May 31, 2018, which claims priority to the Chinese patent application No. 201710842233.X, filed on Sep. 18, 2017 and entitled "DISPLAY SUBSTRATE, DISPLAY DEVICE, AND MANUFACTURING METHOD OF DISPLAY SUBSTRATE", the entire disclosure of which is hereby incorporated by reference.

TECHNICAL FIELD

The present disclosure relates to the field of display devices, and in particular, to a display substrate, a display device, and a manufacturing method of a display substrate.

BACKGROUND

Organic Light-Emitting Display (OLED) is a widely used mainstream display with advantages of ultra-thin size and low production cost, etc.

The display panel of the OLED generally includes a display substrate and a cover plate. The display substrate is provided with an OLED pixel unit thereon, and the cover plate is over the OLED pixel unit on the display substrate. The OLED pixel unit includes an electrode, an organic thin film layer and another electrode which are sequentially disposed on the display substrate. The organic thin film layer mainly includes a hole injection layer, a hole transport layer, an organic light emitting layer and an electron transport layer which are stacked on the electrode. The manufacturing method of the organic thin film layer of the OLED pixel unit mainly includes the following two methods: one is an evaporation method, and the other is an inkjet printing method. The inkjet printing method refers to uniformly depositing a liquid organic material to form an organic thin film layer.

In the process of inkjet printing, organic material is injected into each sub-pixel region through a nozzle. The thickness of the film formed by drying the organic material in the sub-pixel region is uneven. Due to the coffee ring effect, after drying, the organic material usually presents a shape of a thicker middle portion, a gradually thinner transition from the middle to the edge, and a rapidly thicken edge. Due to the uneven thickness distribution, the film formed in each sub-pixel usually has only a small area in the middle with relatively e thickness which can emit light of a normal color, and the remaining portion may emit light different in color from the normal color, thus affecting the display effect.

SUMMARY

In an aspect, an arrangement of the present disclosure provides a display substrate. The display substrate includes a base substrate, and a pixel defining layer disposed on the base substrate. The pixel defining layer divides the base substrate into a plurality of sub-pixel regions. An orthographic projection of at least one of the sub-pixel regions on the base substrate is approximately a quadrilateral. The quadrilateral includes a first side, a second side, a third side and a fourth side connected end to end. The first side and the third side are disposed opposite to each other. The first side and the third side are inwardly recessed toward each other.

In some arrangements, a perpendicular distance between the first side and a first line segment gradually increases and then gradually decreases in an extending direction of the first line segment. A perpendicular distance between the third side and a second line segment gradually increases and then gradually decreases in an extending direction of the second line segment. The first line segment is a line segment connecting two ends of the first side, and the second line segment is a line segment connecting two ends of the third side.

In some arrangements, a point on the first side to which a perpendicular distance from the first line segment is the largest is an intersection of a mid-perpendicular line of the first line segment with the first side. A point on the third side to which a perpendicular distance from the second line segment is the largest is an intersection of a mid-perpendicular line of the second line segment with the third side.

In some arrangements, the second side and the fourth side are recessed toward inside of the quadrilateral.

In some arrangements, an orthographic projection of the sub-pixel region on the base substrate is a rectangle with a curved side.

In some arrangements, the pixel defining layer is provided with an expansion groove. The expansion groove is located at one corner of the sub-pixel region, and is in communication with the sub-pixel region.

In some arrangements, an orthographic projection of an inner sidewall of the expansion groove on the base substrate is a superior arc.

In some arrangements, a radius of the superior arc is ⅛ to 1/12 of a length of a shorter side of the sub-pixel region.

In some arrangements, in a direction perpendicular to the base substrate, the expansion groove has a depth smaller than a thickness of the pixel defining layer.

In some arrangements, a difference between a thickness of the pixel defining layer and a depth of the expansion groove is 1000 angstroms to 2000 angstroms.

In some arrangements, a length of the first side and the third side is larger than a length of the second side and the fourth side.

In some arrangements, the first side and the third side are arc sides. A circle height of the arc side is ⅛~1/12 of the length of the second side or the fourth side, where the circle height of the arc side is a difference between a radius of the arc side and a chord distance of a chord opposite to the arc side.

In some arrangements, the display substrate further includes an electrode disposed between the base substrate and the pixel defining layer. The orthographic projection of the sub-pixel region on the base substrate is within an orthographic projection of the electrode on the base substrate.

In another aspect, an arrangement of the present disclosure provides a display device including the display substrate described above.

In yet another aspect, an arrangement of the present disclosure provides a manufacturing method of a display substrate. The method includes providing a base substrate. The method includes forming a pixel defining layer on the base substrate. The pixel defining layer divides the base substrate into a plurality of sub-pixel regions. An orthographic projection of at least one of the sub-pixel regions on the base substrate is approximately a quadrilateral. The quadrilateral includes a first side, a second side, a third side and a fourth side connected end to end. The first side and the third side are disposed opposite to each other. The first side and the third side are inwardly recessed toward each other.

In some arrangements, a perpendicular distance between the first side and a first line segment gradually increases and then gradually decreases in an extending direction of the first line segment. A perpendicular distance between the third side and a second line segment gradually increases and then gradually decreases in an extending direction of the second line segment. The first line segment is a line segment connecting two ends of the first side, and the second line segment is a line segment connecting two ends of the third side.

In some arrangements, forming a pixel defining layer on the base substrate includes forming a transparent insulating film layer on the base substrate, and forming a sub-pixel opening and an expansion groove on the transparent insulating film layer. The expansion groove is located at one corner of the sub-pixel opening and is in communication with the sub-pixel opening.

In some arrangements, forming a pixel defining layer on the base substrate includes forming a first transparent insulating film layer on the base substrate. Such an operation further includes forming a sub-pixel opening on the first transparent insulating film layer. Such an operation further includes forming a second transparent insulating film layer on the first transparent insulating film layer. Such an operation further includes forming the expansion groove on the second transparent insulating film layer.

BRIEF DESCRIPTION OF THE DRAWINGS

In order to more clearly illustrate the technical solutions in the arrangements of the present disclosure, the drawings used in the description of the arrangements will be briefly described below. Apparently, the drawings in the following description are only some arrangements of the present disclosure. Other drawings may also be obtained from these drawings by those ordinary skilled in the art without paying creative effort.

DETAILED DESCRIPTION

The arrangements of the present disclosure will be further described in detail below with reference to the accompanying drawings.

Figure 1:
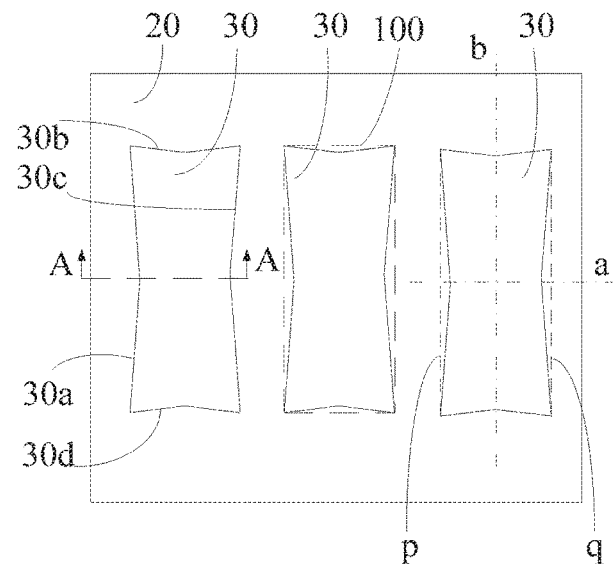
FIG. 1 is a partial plan view of a display substrate according to an arrangement of the present disclosure.
Figure 2:
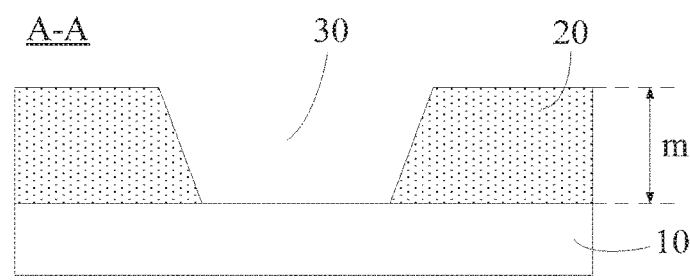
FIG. 2 is a cross-sectional view taken along line A-A of FIG. 1.

FIG. 1 is a partial plan view of a display substrate according to an arrangement of the present disclosure. FIG. 2 is a cross-sectional view taken along line A-A of FIG. 1. As shown in FIGS. 1 and 2, the display substrate includes a base substrate 10 and a pixel defining layer 20 disposed on the base substrate 10. Referring to FIG. 1, the pixel defining layer 20 divides the base substrate 10 into a plurality of sub-pixel regions 30.

Optionally, the base substrate 10 may be a transparent substrate such as a glass substrate, a silicon substrate, a plastic substrate, or the like. The pixel defining layer 20 may be made of a transparent insulating material such as polyimide, silicon nitride, or silicon oxide.

As shown in FIG. 1, the orthographic projection of each of at least one sub-pixel region 30 on the base substrate 10 is approximately quadrilateral, and the quadrilateral includes a first side 30a, a second side 30b, a third side 30c and a fourth side 30d, which are sequentially connected end to end. The first side 30a and the third side 30c are disposed opposite to each other, and the second side 30b and the fourth side 30d are respectively connected with their both ends between the first side 30a and the third side 30c. The first side 30a and the third side 30c are recessed toward the inside of the quadrilateral.

For example, the perpendicular distance between the first side 30a and the first line segment p gradually increases and then gradually decreases in the extending direction of the first line segment p, and the perpendicular distance between the third side 30c and the second line segment q is gradually increased and then gradually decreased in the extending direction of the second segment q. The first segment p is a line segment connecting the two ends of the first side 30a, and the second segment q is a line segment connecting the two ends of the third side 30c. In this way, the quadrilateral is gradually narrowed respectively from edges of the first side 30a and the third side 30c to the middle portion.

Figure 4:
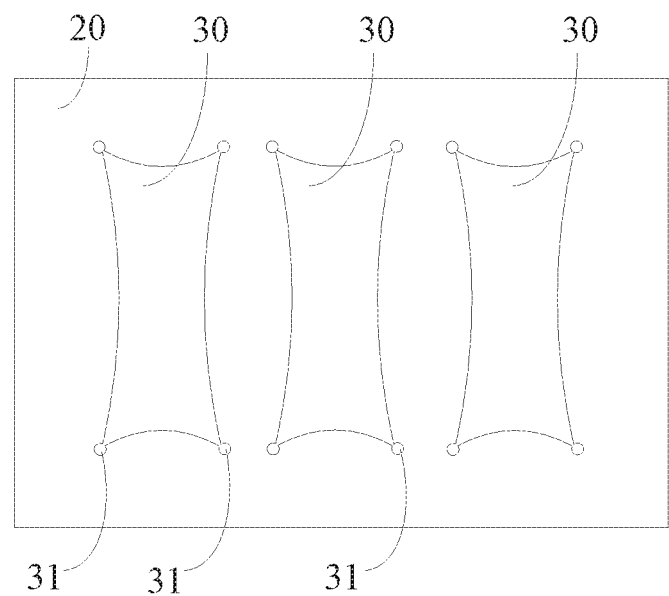
FIG. 4 is a schematic structural diagram of another display substrate according to an arrangement of the present disclosure.

It should be noted that, in the arrangement of the present disclosure, "approximately quadrilateral" includes at least two cases. The first case is to directly connect every adjacent two corners of the four corners of a quadrilateral to form a first side, a second side, a third side, and a fourth side of the quadrilateral. The second case is to further provide an expansion groove on at least one of the four corners of the quadrilateral (see the arrangement below), and in this case, the quadrangular shape formed by connecting the four corners through the expansion grooves is approximately quadrilateral. For example, as shown in FIG. 4, the expansion groove is provided at each of the four corners, but the present disclosure is not limited thereto. As long as the orthographic projection of the at least one of the sub-pixel regions 30 on the base substrate 10 appears to be approximately quadrangular, it is possible to make a slight change to the patterns, which is within the protection scope of the present disclosure.

In addition, the "sequentially connected end to end" in the arrangement of the present disclosure does not necessarily require the strict end-to-end connection of the quadrilateral. For example, as shown in FIG. 4, if at least one corner of the quadrilateral is provided with an expansion groove, the four sides of the quadrilateral are not strictly sequentially connected end to end, and there are expansion grooves in between, but the case of FIG. 13 in the present disclosure also belongs to a case where the four sides of the quadrilateral are sequentially connected end to end.

Further, the second side 30b and the fourth side 30d may also be recessed toward the inside of the quadrilateral, and the quadrilateral is gradually narrowed respectively from the edges of the second side 30b and the fourth side 30d to the middle portion. This makes the thickness of the formed film layer more uniform.

For example, the point on the first side 30a to which the perpendicular distance from the first line segment p is the largest is the intersection of the mid-perpendicular line of the first line segment p with the first side 30a, and the point on the third side 30c to which the perpendicular distance from the second line segment q is the largest is the intersection of the mid-perpendicular line of the second line segment q with the third side 30c. In this way, the middle portion of the sub-pixel region can be made narrower, and the ink may flow to the periphery when it is dried, which can facilitate forming a film with a relatively large area of even thickness in the middle of the sub-pixel region.

Optionally, the four vertices of the quadrilateral described above are respectively located at four vertices of the rectangle 100, which can facilitate the arrangement of the sub-pixels and make the arrangement of the sub-pixels tidier.

Further, the orthographic projection of the sub-pixel region 30 on the base substrate 10 is an axisymmetric pattern, and the orthographic projections may have two axes of symmetry (such as the axis of symmetry a and the axis of symmetry b in FIG. 1). The two axes of symmetry may be a mid-perpendicular line connecting the two ends of the first side 30a and a mid-perpendicular line connecting the two ends of the second side 30b, respectively. This can make the arrangement of sub-pixels tidier.

Figure 3:
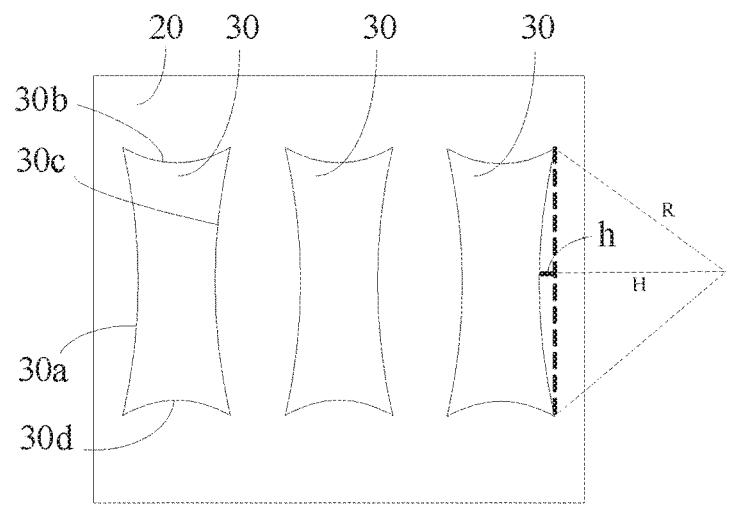
FIG. 3 is a partial plan view of another display substrate according to an arrangement of the present disclosure.

FIG. 3 is a partial plan view of another display substrate according to an arrangement of the present disclosure. As shown in FIG. 3, the four sides of the quadrilateral are all curved sides, so that the orthographic projection of the sub-pixel region 30 on the base substrate 10 is a rectangle with a curved side. The rectangle with a curved side refers to a pattern obtained by replacing at least one side of the rectangle with a curved side. For example, the rectangle with a curved side formed by the orthographic projection of the sub-pixel region 30 is a pattern obtained by replacing the four sides of a rectangle with curved sides. In other arrangement of the present disclosure, the sub-pixel region 30 may also have only two opposite sides as curved sides. For example, only the first side 30a and the third side 30c are curved sides.

In the arrangement of the present disclosure, by changing the shape of the sub-pixel region, the orthographic projection of the sub-pixel region on the base substrate is approximately quadrangular. In the quadrilateral, the first side and the opposite third side are recessed toward the inside of the quadrilateral, such that the sub-pixel region has a narrower area, which can reduce the amount of ink accumulated in the narrower area during inkjet printing. While in the drying process of the ink, at the beginning, ink in the narrower area of the sub-pixel region may be at a high level, since the ink in the narrower area is dried slower than ink at the edge, due to the Marathon effect, the ink in the narrower area will flow in two directions respectively approaching the second side and the fourth side, which can further reduce the amount of the ink in the narrower region. In this way, the ink distribution can be more uniform, and can reduce the thickness of the film formed in the narrower region in the sub-pixel region, such that the thickness of the film formed after the ink is completed dried can be more uniform. In addition, since the first side and the third side are recessed toward the inside of the quadrilateral, during the drying process, the ink may flow more toward the edges of the first side and the third side, which can increase the thickness of the film in the region of the sub-pixel region where the edge thickness is small, and thus can form a film with a larger area of even thickness in the sub-pixel region.

In other arrangement, the perpendicular distance between the first side and the first line segment gradually increases and then gradually decreases in the extending direction of the first line segment, and the perpendicular distance between the third side and the second line segment gradually increases and then gradually decreases in the extending direction of the second line segment. During the drying process, the ink may flow more toward the edges of the first side and the third side, which can increase the thickness of the film in the region of the sub-pixel region where the edge thickness is small, and thus can form a film with a larger area of even thickness in the sub-pixel region.

For example, the length of the first side 30a or the third side 30c is larger than the length of the second side 30b or the fourth side 30d. The two longer sides of the sub-pixel region 30 may be curved sides, and the longer curved sides can cause the ink in the middle of the sub-pixel region to flow toward the two short sides spaced farther apart during the drying process, so that the ink can be distributed more evenly and the thickness of the resulting film is more uniform. The longer sides of the sub-pixel region 30 (for example, the first side 30a and the third side 30c shown in FIG. 3) refer to the curved sides having common ends with the long sides of the rectangle formed by the four vertices of the sub-pixel region 30.

In the rectangle formed by the four vertices of the sub-pixel region 30, the ratio of the lengths between the long side and the short side may be 3:1 to 1:1. In an arrangement of the present disclosure, the ratio of the lengths between the long side and the short side is 3:1. It should be noted that the ratio of the lengths between adjacent sides of the rectangle formed by the four vertices of the sub-pixel region may also be 1:1, and in this case the four vertices of the sub-pixel region 30 constitute a square.

As shown in FIG. 3, the first side 30a and the third side 30c may be arc sides, and the circle height h of the arc side is ⅛~1/12 of the length of the second side 30b or the fourth side 30d of the sub-pixel region 30, where the circle height h of the arc side is a difference between the radius of the arc side (R in FIG. 3) and the chord distance (H in FIG. 3) of the chord opposite to the arc side. If the circle height h is too small, during the drying process, the flow of the ink to the two short sides is not significant, and the degree of influence on the film thickness is too small. If the circle height h is too large, the middle portion of the sub-pixel region 30 may be too narrow, and there may be a large non-light-emitting region between adjacent sub-pixel regions 30, thus causing the brightness of the pixel to decrease. It should be noted that, in the arrangement of the present disclosure, the length of a certain side of the sub-pixel region 30 refers to the linear distance between the two ends of the side.

When the second side 30b and the fourth side 30d are also arc sides, the circle height of the second side 30b or the fourth side 30d is in proportion to the circle height of the first side 30a or the third side 30c, and the ratio is equal to the ratio of the lengths of the short sides to the long sides of the rectangle formed by the four vertices of the sub-pixel region 30.

In one implementation of the present disclosure, the thickness m of the pixel defining layer 20 does not exceed 3 μm, which is 1.5 to 2 μm in this arrangement. If the thickness m of the pixel defining layer 20 is too large, the thickness of the display substrate may be increased. If the thickness m of the pixel defining layer 20 is too small, the light emitted from the sub-pixel region 30 may be easily entered into the adjacent sub-pixel region 30, thus affecting the display effect.

The thickness m of the pixel defining layer 20 refers to a perpendicular distance from the surface of the pixel defining layer 20 which is away from the base substrate 10 and parallel to the base substrate 10, to the base substrate 10.

FIG. 4 is a schematic structural diagram of another display substrate according to an arrangement of the present disclosure. As shown in FIG. 4, the pixel defining layer 20 may further be provided with an expansion groove 31, and the expansion groove 31 is located at at least one corner of the sub-pixel region 30 and is in communication with the sub-pixel region 30. By providing the expansion groove 31, ink may flow into the expansion groove 31 during inkjet printing. During the drying process of the ink, the ink located in the expansion groove 31 may be dried first, so that the ink in the sub-pixel region 30 may flow into the expansion groove 31, and thus it can eliminate the need to form a film with an excessively large thickness at the edge of the sub-pixel region 30 and it can make the thickness of the film in the sub-pixel region 30 more uniform.

Figure 5:
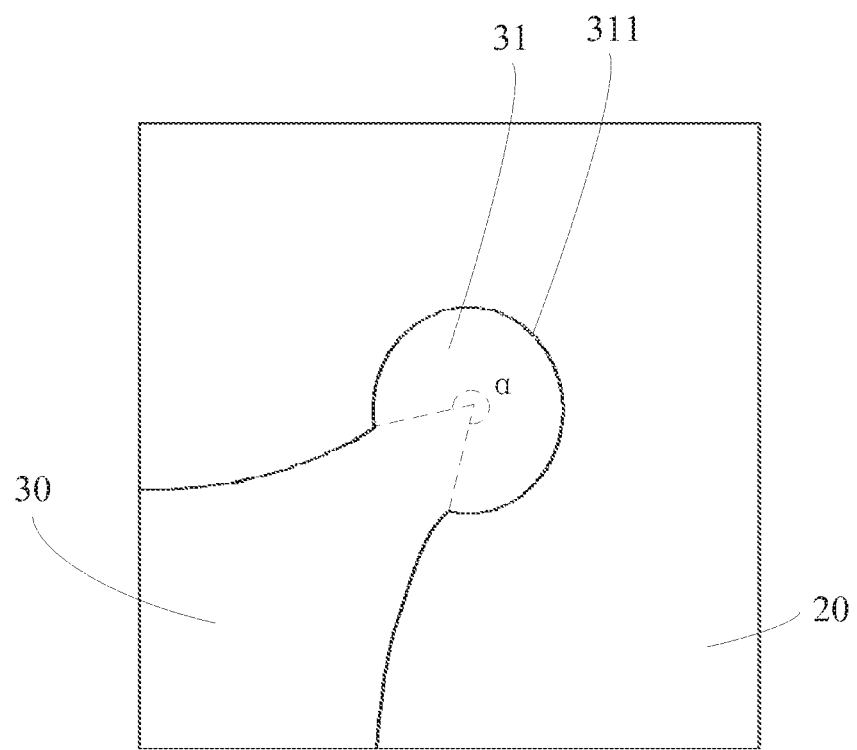
FIG. 5 is a partially enlarged view of a display substrate according to an arrangement of the present disclosure.

FIG. 5 is a partially enlarged view of a display substrate according to an arrangement of the present disclosure. As shown in FIG. 5, the orthographic projection of the inner sidewall of the expansion groove 31 on the base substrate 10 may be a superior arc 311.

Further, the central angle α of the superior arc 311 may be 300°.

Optionally, the expansion groove 31 may be provided at each of the four corners of the sub-pixel region 30, thus making the formed film have more uniform thickness.

In other arrangements of the present disclosure, the expansion groove 31 may also be provided only at a part of the corners.

Further, the radius of the superior arc 311 may be ⅛ to 1/12 of the length of the shorter side of the sub-pixel region 30. When the film is made more uniform, it can prevent too large space between sub-pixels due to too large size of the expansion groove 31 and prevent a low density of the sub-pixel arrangement.

Figure 6:
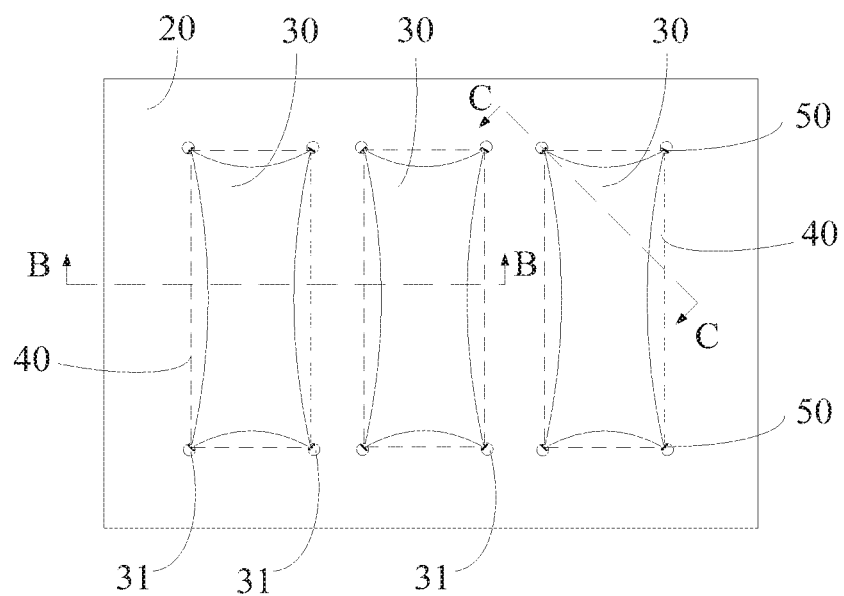
FIG. 6 is a top plan view of another display substrate according to an arrangement of the present disclosure.
Figure 7:
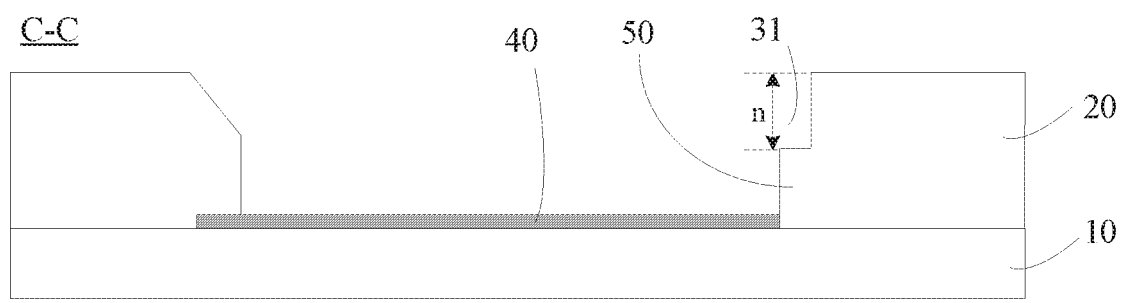
FIG. 7 is a cross-sectional view taken along line C-C of FIG. 6.

FIG. 6 is a top plan view of another display substrate according to an arrangement of the present disclosure. As shown in FIG. 6, the display substrate further includes an electrode 40 disposed between the base substrate 10 and the pixel defining layer 20 (as shown by the dotted line in FIG. 6), and the electrodes 40 are disposed in one-to-one correspondence with the sub-pixel regions 30. FIG. 7 is a cross-sectional view of FIG. 6 along C-C. As shown in FIG. 7, the bottom of the expansion groove 31 is provided with an insulating layer 50 such that the depth of the expansion groove 31 is smaller than the thickness of the pixel defining layer 20 in a direction perpendicular to the base substrate 10. In this way, after the ink is dropped into the sub-pixel region 30, the ink located in the expansion groove 31 is shallow (the level of the ink in the depth direction of the expansion groove), and the ink in the expansion groove 31 can be dried faster during the drying process. Then, ink can be continuously replenished from the sub-pixel region 30 into the expansion groove 31, thus facilitating the flow of ink into the expansion groove 31. Moreover, during fabrication it is difficult to completely exclude overlapping between the projection of the expansion groove 31 on the base substrate 10 and the electrode 40, and if there is an overlapping area between the projection of the expansion groove 31 on the base substrate 10 and the electrode 40, light may be emitted through the film formed by drying the ink in the expansion groove 31. The insulating layer 50 may be provided to separate the electrode 40 and the organic material in the expansion groove 31, and it can prevent light from being emitted through the film formed in the expansion groove 31 under action of the electrode.

Further, the difference between the thickness of the pixel defining layer 20 and the depth of the expansion groove 31 (n in FIG. 7) does not exceed 2000 angstroms. That is, the thickness of the insulating layer 50 does not exceed 2000 angstroms. For example, it may be from 1000 angstroms to 2000 angstroms. If the difference is too large, the expansion groove 31 may be too shallow, so that it is difficult for the ink to flow into the expansion groove 31.

Optionally, the orthographic projection of the sub-pixel region 30 on the base substrate 10 may be located within the orthographic projection of the electrode 40 on the base substrate 10, such that the organic thin film layer formed by printing in the sub-pixel region 30 can emit light.

Figure 8:
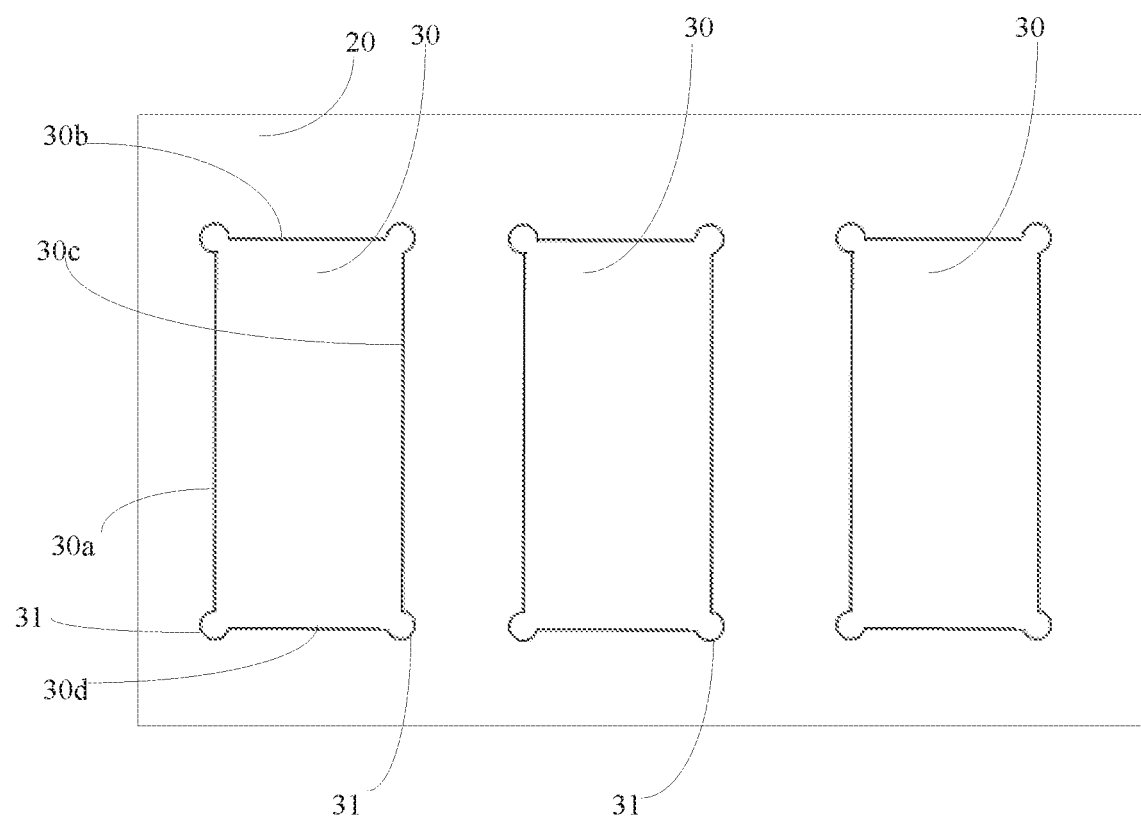
FIG. 8 is a partial plan view of still another display substrate according to an arrangement of the present disclosure.

FIG. 8 is a schematic structural diagram of still another display substrate according to an arrangement of the present disclosure. As shown in FIG. 8, the display substrate includes a base substrate and a pixel defining layer 20 disposed on the base substrate. Referring to FIG. 8, the pixel defining layer 20 divides the base substrate into a plurality of sub-pixel regions 30.

As shown in FIG. 8, the orthographic projection of at least one of the sub-pixel regions 30 on the base substrate is approximately rectangular (ignoring the influence of the expansion groove 31). The rectangle includes substantially a first side 30a, a second side 30b, a third side 30c and a fourth side 30d, which are sequentially connected end to end (again, ignoring the influence of the expansion groove 31). The first side 30a and the third side 30c are disposed opposite to each other. The difference from the arrangement shown in FIGS. 1-7 lies in that the first side 30a, the second side 30b, the third side 30c and the fourth side 30d are all line segments connecting two adjacent ends of the rectangle, and none of the first side 30a, the second side 30b, the third side 30c and the fourth side 30d is recessed toward the inside of the rectangle. That is, the rectangle is not gradually narrowed from the two ends of the first side 30a or the third side 30c to the middle. In the arrangement shown in FIG. 8, the rectangle is not gradually narrowed from the both ends of the second side 30b or the fourth side 30d to the middle.

For example, the pixel defining layer 20 may further be provided with an expansion groove 31 located at at least one corner of the sub-pixel region 30 and is in communication with the sub-pixel region 30. By providing the expansion groove 31, ink may flow into the expansion groove 31 during inkjet printing. During the drying process of the ink, the ink located in the expansion groove 31 may be dried first, so that the ink in the sub-pixel region 30 may flow into the expansion groove 31, and thus it can eliminate the need to form a film with an excessively large thickness at the edge of the sub-pixel region 30 and it can make the thickness of the film in the sub-pixel region 30 more uniform.

Optionally, the orthographic projection of the inner sidewall of the expansion groove 31 on the base substrate may be a superior arc.

Further, the central angle of the superior arc may be 300°.

Optionally, the expansion groove 31 may be provided at each of the four corners of the sub-pixel region 30, thus making the formed film have more uniform thickness.

In other arrangement of the present disclosure, the expansion groove 31 may also be provided only at a part of the corners.

Further, the radius of the superior arc may be ⅛ to 1/12 of the length of the shorter side of the sub-pixel region 30. When the film is made more uniform, it can prevent too large space between sub-pixels due to too large size of the expansion groove 31 and prevent a low density of the sub-pixel arrangement.

It should be noted that, in other arrangement, an orthographic projection of each of the at least one sub-pixel region 30 on the base substrate may be approximately a quadrilateral, and any one or more of the four sides of the quadrilateral may be recessed toward the inner side of the quadrilateral, and the other sides are line segments connecting the two ends of the respective sides. In addition, at least one corner of the quadrilateral may be provided with the expansion groove 31.

The arrangement of the present disclosure further provides a display device including any of the display substrates shown in FIGS. 1-8. The display device can be any display product or component with display function, such as: electronic paper, a mobile phone, a tablet computer, a television, a display, a notebook computer, a digital photo frame, a navigator and the like.

In the arrangement of the present disclosure, by changing the shape of the sub-pixel region, the orthographic projection of the sub-pixel region on the base substrate is approximately quadrangular. In the quadrilateral, the first side and the opposite third side are recessed toward the inside of the quadrilateral, such that the sub-pixel region has a narrower area, which can reduce the amount of ink accumulated in the narrower area during inkjet printing. While in the drying process of the ink, at the beginning, ink in the narrower area of the sub-pixel region may be at a high level, since the ink in the narrower area is dried slower than ink at the edge, due to the Marathon effect, the ink in the narrower area will flow in two directions respectively approaching the second side and the fourth side, which can further reduce the amount of the ink in the narrower region. In this way, the ink distribution can be more uniform, and can reduce the thickness of the film formed in the narrower region in the sub-pixel region, such that the thickness of the film formed after the ink is completed dried can be more uniform. In addition, since the first side and the third side are recessed toward the inside of the quadrilateral, during the drying process, the ink may flow more toward the ends of the first side and the third side, which can increase the thickness of the film in the region of the sub-pixel region where the edge thickness is small, and thus can form a film with a larger area of even thickness in the sub-pixel region.

In other arrangement, the perpendicular distance between the first side and the first line segment gradually increases and then gradually decreases in the extending direction of the first line segment, and the perpendicular distance between the third side and the second line segment gradually increases and then gradually decreases in the extending direction of the second line segment. During the drying process, the ink may flow more toward the ends of the first side and the third side, which can increase the thickness of the film in the region of the sub-pixel region where the edge thickness is small, and thus can form a film with a larger area of even thickness in the sub-pixel region.

Figure 9:
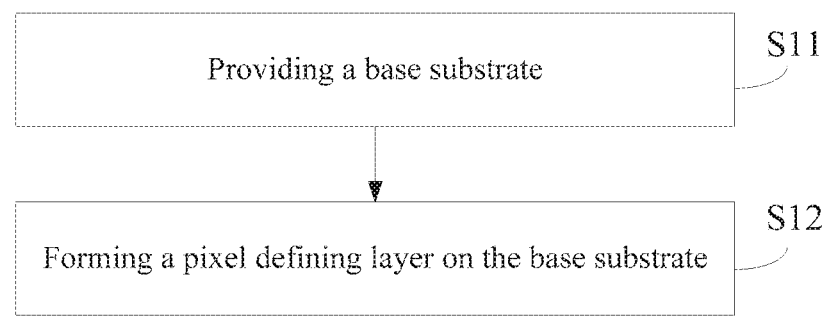
FIG. 9 is a flowchart of a manufacturing method of a display substrate according to an arrangement of the present disclosure.

FIG. 9 is a flowchart of a manufacturing method of a display substrate according to an arrangement of the present disclosure, which is applicable for manufacturing any one of the display substrates shown in FIG. 1 to FIG. 8. As shown in FIG. 9, the manufacturing method includes the following blocks.

In block S11, a base substrate is provided.

In block S12, a pixel defining layer is formed on the base substrate.

The pixel defining layer divides the base substrate into a plurality of sub-pixel regions. The orthographic projection of each of the at least one sub-pixel region on the base substrate is a quadrilateral, and the quadrilateral includes a first side, a second side, a third side and a fourth side, which are sequentially connected end to end. The first side and the third side are disposed opposite to each other, and the first side and the third side are recessed toward the inner side of the quadrilateral.

For example, the perpendicular distance between the first side and the first line segment gradually increases and then gradually decreases in the extending direction of the first line segment, and the perpendicular distance between the third side and the second line segment is gradually increased and then gradually decreased in the extending direction of the second segment. The first segment is a line segment connecting the two ends of the first side, and the second segment is a line segment connecting the two ends of the third side.

For example, the point on the first side to which the perpendicular distance from the first line segment is the largest is the intersection of the mid-perpendicular line of the first line segment with the first side, and the point on the third side to which the perpendicular distance from the second line segment is the largest is the intersection of the mid-perpendicular line of the second line segment with the third side. In this way, the quadrilateral gradually narrows from the both ends of the first side of the third side toward the middle.

In the arrangement of the present disclosure, by changing the shape of the sub-pixel region, the orthographic projection of the sub-pixel region on the base substrate is a quadrangular. In the quadrilateral, the first side and the opposite third side are recessed toward the inside of the quadrilateral, such that the sub-pixel region has a narrower area, which can reduce the amount of ink accumulated in the narrower area during inkjet printing. While in the drying process of the ink, at the beginning, ink in the narrower area of the sub-pixel region may be at a high level, since the ink in the narrower area is dried slower than ink at the edge, due to the Marathon effect, the ink in the narrower area will flow in two directions respectively approaching the second side and the fourth side, which can further reduce the amount of the ink in the narrower region. In this way, the ink distribution can be more uniform, and can reduce the thickness of the film formed in the narrower region in the sub-pixel region, such that the thickness of the film formed after the ink is completed dried can be more uniform. In addition, since the first side and the third side are recessed toward the inside of the quadrilateral, during the drying process, the ink may flow more toward the ends of the first side and the third side, which can increase the thickness of the film in the region of the sub-pixel region where the edge thickness is small, and thus can form a film with a larger area of even thickness in the sub-pixel region.

In other arrangement, the perpendicular distance between the first side and the first line segment gradually increases and then gradually decreases in the extending direction of the first line segment, and the perpendicular distance between the third side and the second line segment gradually increases and then gradually decreases in the extending direction of the second line segment. During the drying process, the ink may flow more toward the ends of the first side and the third side, which can increase the thickness of the film in the region of the sub-pixel region where the edge thickness is small, and thus can form a film with a larger area of even thickness in the sub-pixel region.

Figure 10:
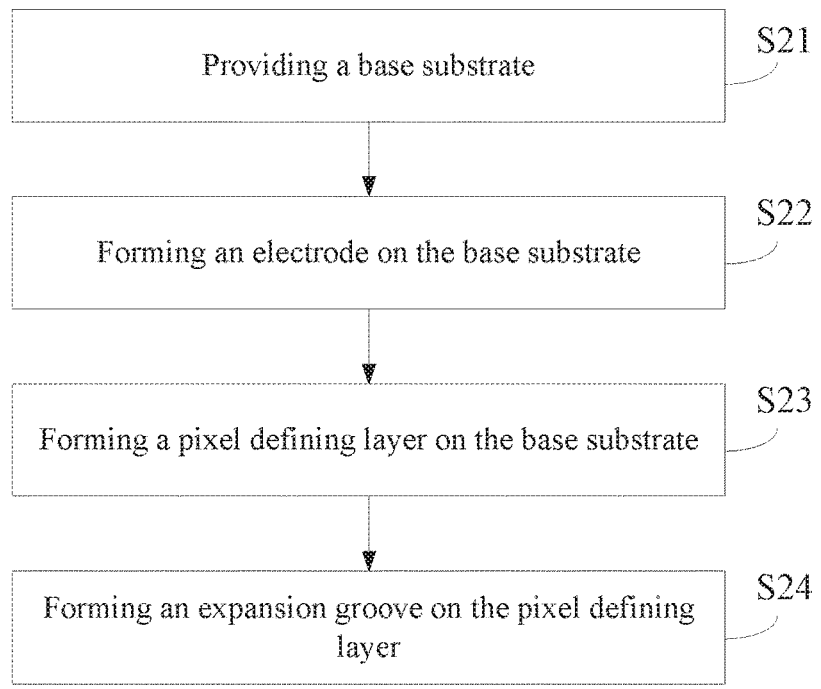
FIG. 10 is a flowchart of another manufacturing method of a display substrate according to an arrangement of the present disclosure.

FIG. 10 is a flowchart of another manufacturing method of a display substrate according to an arrangement of the present disclosure, which is applicable for manufacturing the display substrate shown in FIG. 6. The present disclosure will be described in detail below with reference to FIGS. 11 to 14. As shown in FIG. 10, the manufacturing method includes the following blocks.

In block S21, a base substrate is provided.

Optionally, the base substrate may be a transparent substrate such as a glass substrate, a silicon substrate, a plastic substrate, or the like.

The base substrate may be subjected to a cleaning process in block S21.

In block S22, an electrode is formed on the base substrate.

Figure 11:
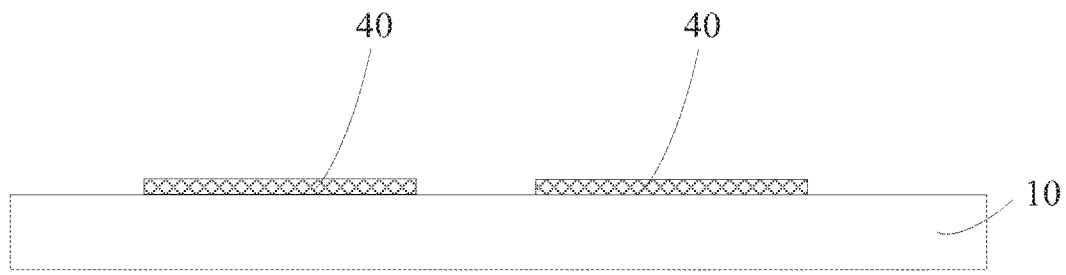
FIG. 11 to FIG. 15 are schematic structural diagrams showing the manufacture of a display substrate according to an arrangement of the present disclosure.

As shown in FIG. 11, a plurality of electrodes 40 are formed on the base substrate 10. The plurality of electrodes 40 may be arranged in an array on the base substrate 11.

For example, block S22 may include:
forming a thin film layer of an electrode material on the base substrate 10; and
forming a plurality of electrodes 40 by a patterning process.

For example, a thin film layer of an electrode material may be formed on the base substrate 10 by magnetron sputtering or evaporation, so that the thin film layer of the electrode material covers the surface of the base substrate 10. Optionally, when the electrode functions as an anode, the thin film layer of the electrode material may be ITO/Ag/ITO, and when the electrode functions as a cathode, the thin film layer of the electrode material may be Mg/Ag.

In block S23, a pixel defining layer is formed on the base substrate.

Figure 12:
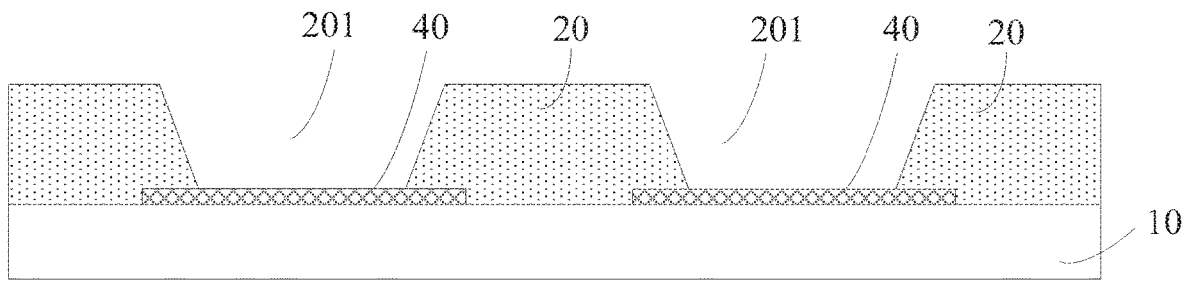

As shown in FIG. 12, a pixel defining layer 20 is formed on the base substrate 10.

For example, block S23 may include:
forming a transparent insulating film layer on the base substrate 10; and
forming a plurality of sub-pixel openings 201 on the transparent insulating film layer to form the pixel defining layer 20.

For example, a layer of silicon nitride or silicon oxide or polyimide may be formed on the base substrate 10 to form a transparent insulating film layer. A plurality of sub-pixel openings 201 arranged in an array may be formed on the transparent insulating film layer by a patterning process, thus dividing the base substrate into a plurality of sub-pixel regions.

It should be noted that FIGS. 11 and 12 are cross-sectional views of the display substrate corresponding to the position B-B in FIG. 6.

Figure 13:
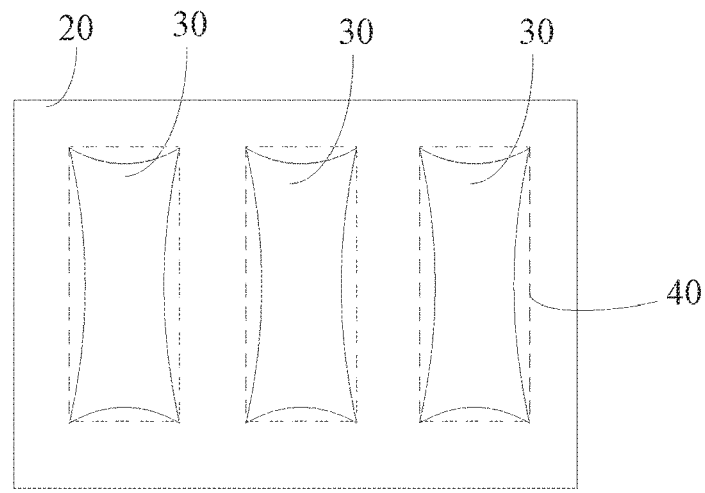

As shown in FIG. 13, the orthographic projection of the sub-pixel region 30 on the base substrate is a rectangle with a curved side, and the four sides of the sub-pixel region 30 are all curved sides, and the four curved sides are all recessed toward the inside of the curved rectangle. The rectangle with a curved side is a pattern obtained by replacing at least one side of the rectangle with a curved side. In other arrangements of the present disclosure, the sub-pixel region may also have only two opposite sides as curved sides.

In block S24, an expansion groove 31 is formed on the pixel defining layer.

Figure 14:
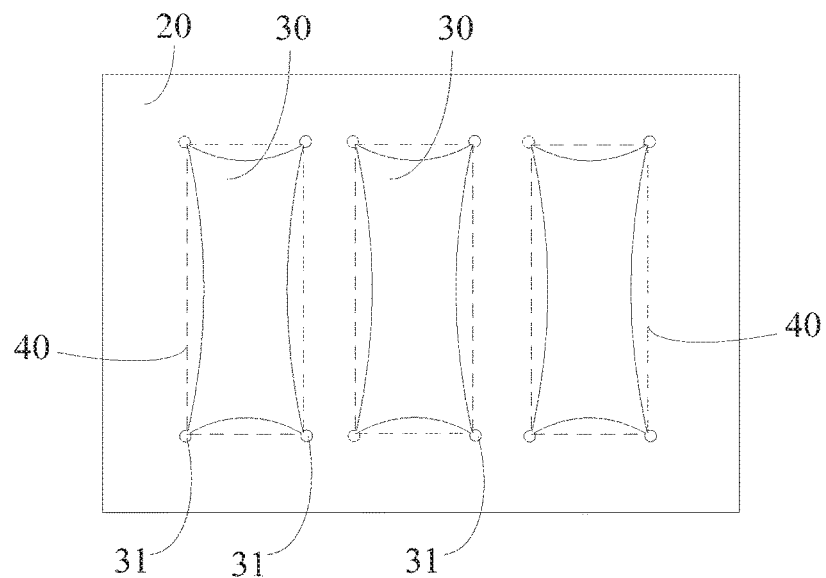

As shown in FIG. 14, a plurality of expansion grooves 31 are formed on the pixel defining layer 20.

The expansion groove 31 is located at at least one corner of the sub-pixel opening 201 and is in communication with the sub-pixel opening 201.

Optionally, the expansion groove 31 is provided at each of the four corners of the sub-pixel opening 201, to make the thickness of the film formed by inkjet printing more uniform.

The specific shape of the expansion groove 31 can be referred to the above arrangements, and will not be detailed here.

For example, the expansion groove 31 may be formed on the pixel defining layer 20 by a photolithography process.

Optionally, block S23 and block S24 can be performed simultaneously, and a plurality of sub-pixel openings 201 and expansion grooves 31 are simultaneously formed on the transparent insulating film layer by a photolithography process to reduce the number of photolithography operations.

Figure 15:
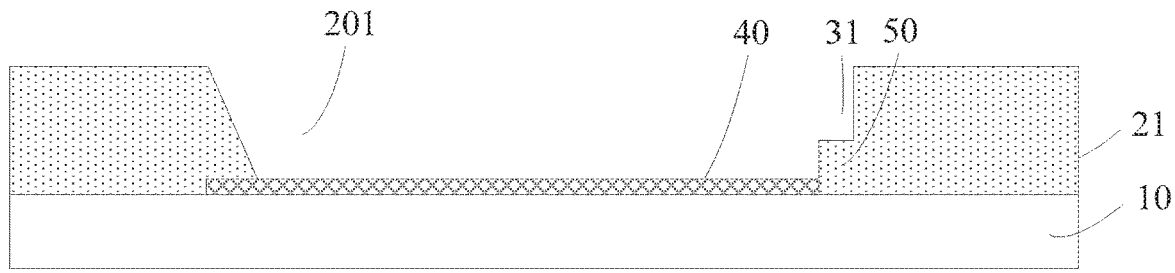

For example, as shown in FIG. 15, photolithography may be performed using a semi-transparent mask such that an insulating layer 50 is left at the bottom of the expansion groove 31, and the depth of the expansion groove 31 is smaller than the thickness of the pixel defining layer 20 in a direction perpendicular to the base substrate 10.

It should be noted that FIG. 15 is a cross-sectional view of the display substrate corresponding to C-C in FIG. 6 during the manufacturing process.

Figure 16:
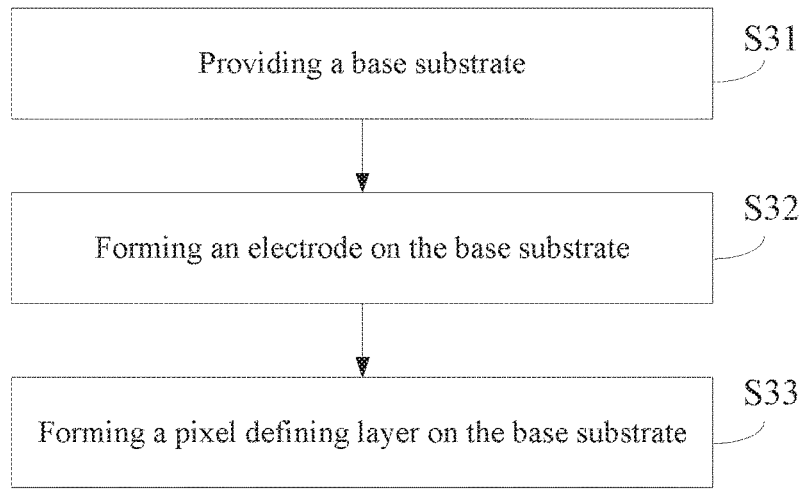
FIG. 16 is a flowchart of another manufacturing method of a display substrate according to an arrangement of the present disclosure.

FIG. 16 is a flowchart of another manufacturing method of a display substrate according to an arrangement of the present disclosure, which is applicable for manufacturing the display substrate shown in FIG. 6. As shown in FIG. 16, the manufacturing method includes the following blocks.

In block S31, a base substrate is provided.

This block is the same as block S21 and will not be repeated here.

In block S32, an electrode is formed on the base substrate.

This block is the same as block S22 and will not be repeated here.

In block S33, a pixel defining layer is formed on the base substrate.

Figure 17:
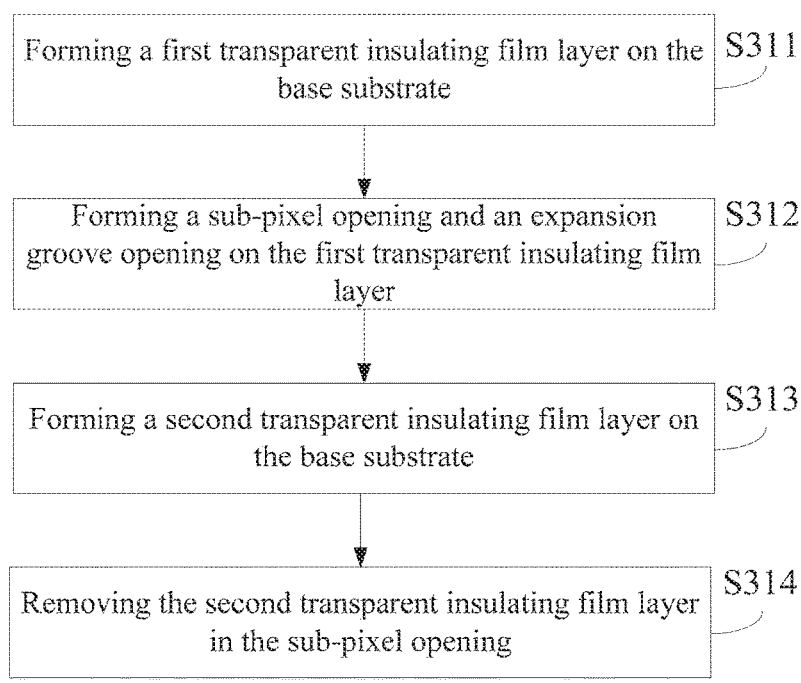
FIG. 17 is a flowchart of a method for fabricating a pixel defining layer according to an arrangement of the present disclosure.

For example, as shown in FIG. 17, block S33 may include the following blocks.

In block S311, a first transparent insulating film layer is formed on the base substrate.

Figure 18:
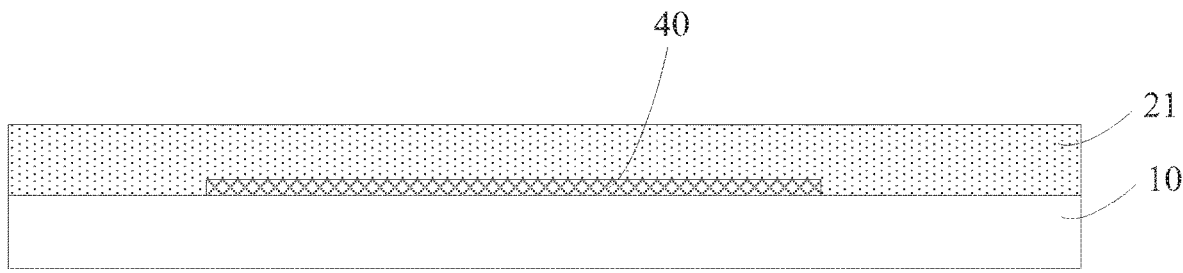
FIG. 18 to FIG. 21 are schematic structural diagrams showing the manufacture of a display substrate according to an arrangement of the present disclosure.

As shown in FIG. 18, a first transparent insulating film layer 21 is formed on the base substrate 10.

For example, a layer of silicon nitride or silicon oxide or polyimide may be formed on the base substrate to form the first transparent insulating film layer 21.

In block S312, a sub-pixel opening and an expansion groove opening is formed on the first transparent insulating film layer.

Figure 19:
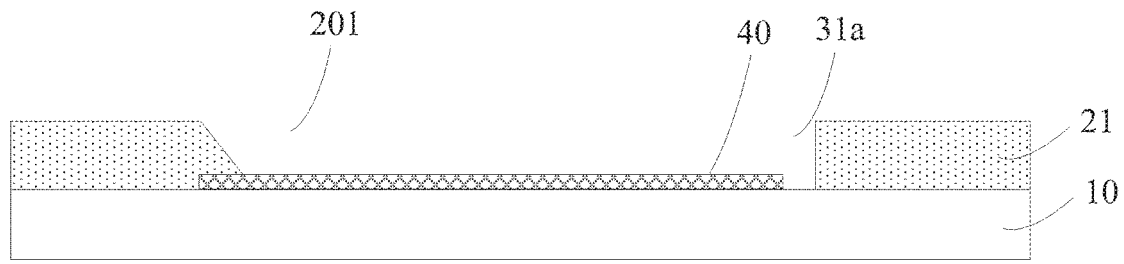

As shown in FIG. 19, a sub-pixel opening 201 and an expansion groove opening 31a are formed on the first transparent insulating film layer 21.

At this time, the depth of the expansion groove opening 31a is the same as the thickness of the first transparent insulating film layer 21 in the direction perpendicular to the base substrate 10.

A plurality of openings arranged in an array may be formed on the first transparent insulating film layer 21 by a patterning process, thus forming a plurality of sub-pixel openings 201 and expansion groove openings 31a.

The first transparent insulating film layer 21 formed with the sub-pixel openings 201 and the expansion groove openings 31a divides the base substrate 10 into a plurality of sub-pixel regions.

In block S313, a second transparent insulating film layer is formed on the base substrate.

Figure 20:
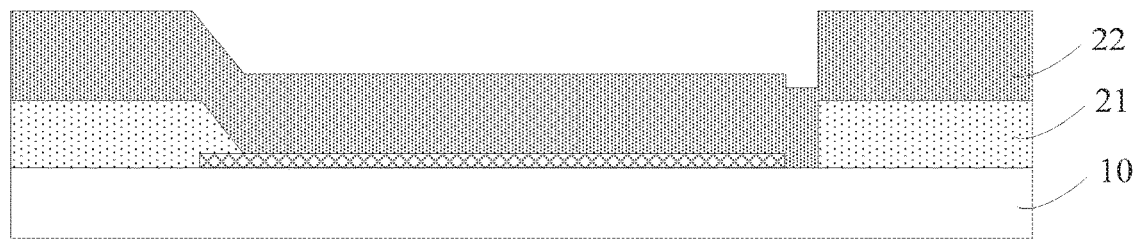

As shown in FIG. 20, a second transparent insulating film layer 22 is formed on the base substrate 10.

The material of the second transparent insulating film layer 22 may be the same as or different from the material of the first transparent insulating film layer 21.

In block S314, the second transparent insulating film layer in the sub-pixel opening is removed.

Figure 21:
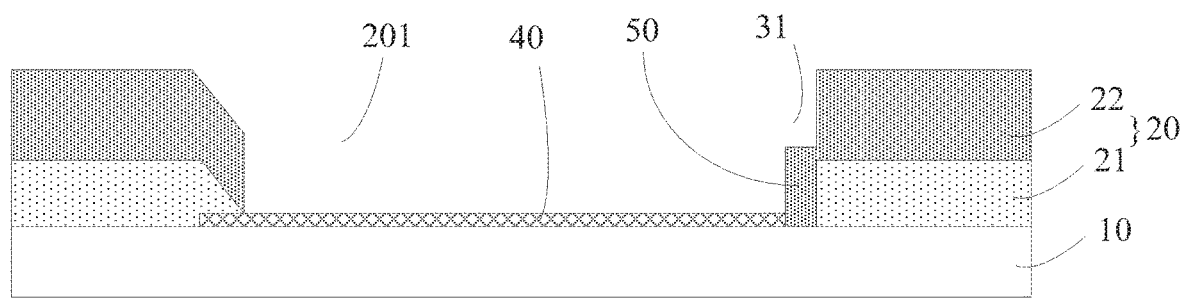

As shown in FIG. 21, the pixel defining layer 20 is formed by the first transparent insulating film layer 21 and the second transparent insulating film layer 22, and the sub-pixel opening 201 and the expansion groove 31 are formed on the pixel defining layer 20. Since only the second transparent insulating film layer 22 in the sub-pixel opening 201 is removed, and the second transparent insulating film layer 22 in the expansion groove opening 31a is not removed, an expansion groove 31 having a depth smaller than the thickness of the pixel defining layer 20 is formed. An insulating layer 50 is left at the bottom of the groove of the expansion groove 31. The insulating layer 50 can separate the electrode 40 from the film formed of the organic material in the expansion groove 31, and prevent light from being emitted through the film formed in the expansion groove 31 under action of the electrode 40.

The second transparent insulating film layer in the sub-pixel region may be removed by a patterning process. Through block S333 and block S334, a pixel defining layer is formed on the base substrate, and a second transparent insulating film layer is also formed at a position corresponding to the expansion groove on the base substrate, thus forming an extension groove having a depth smaller than a thickness of the pixel defining layer. The structure of the base substrate on which the pixel defining layer and the expansion groove are formed can refer to FIG. 7.

It should be noted that FIGS. 18 to 21 are cross-sectional views of the display substrate corresponding to C-C in FIG. 6 during the manufacturing process.

Figure 22:
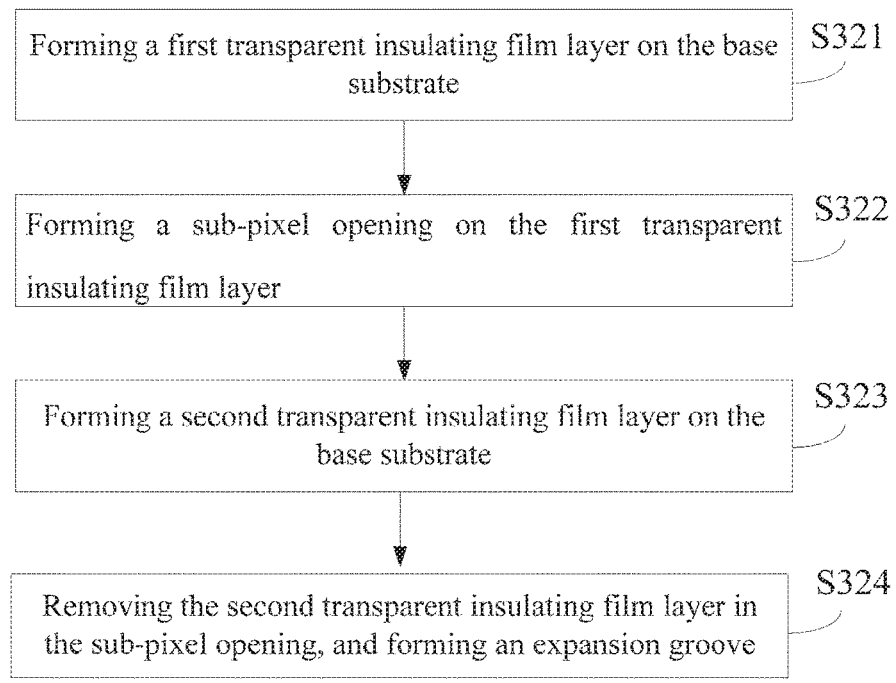
FIG. 22 is a flowchart of another method for fabricating a pixel defining layer according to an arrangement of the present disclosure.

In another arrangement of the present disclosure, as shown in FIG. 22, block S33 may also include the following blocks.

In block S321, a first transparent insulating film layer is formed on the base substrate.

Block S321 can be the same as block S311, and will not be described in detail herein.

In block S322, a sub-pixel opening is formed on the first transparent insulating film layer.

Figure 23:
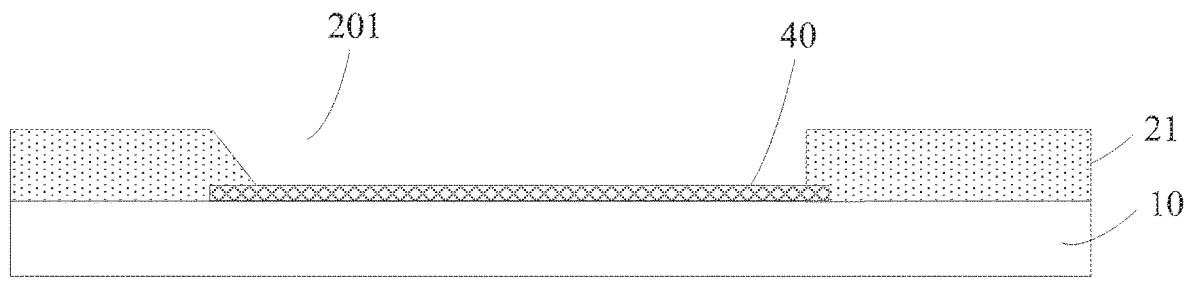
FIG. 23 to FIG. 25 are schematic structural diagrams showing the manufacture of a display substrate according to an arrangement of the present disclosure.

As shown in FIG. 23, a sub-pixel opening is formed on the first transparent insulating film layer 21.

A plurality of sub-pixel openings 201 arranged in an array may be formed on the first transparent insulating film layer 21 by a patterning process, thus dividing the base substrate 10 into a plurality of sub-pixel regions.

In block S323, a second transparent insulating film layer is formed on the base substrate.

Figure 24:
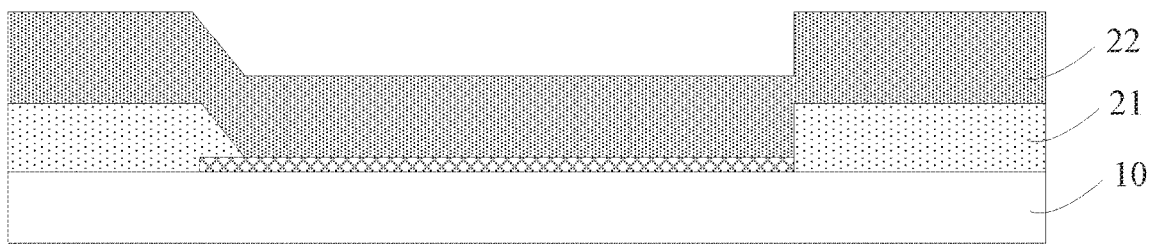

As shown in FIG. 24, a second transparent insulating film layer 22 is formed on the base substrate 10.

The material of the second transparent insulating film layer 22 may be the same as or different from the material of the first transparent insulating film layer 21.

In block S324, the second transparent insulating film layer in the sub-pixel opening is removed, and an expansion groove is formed.

Figure 25:
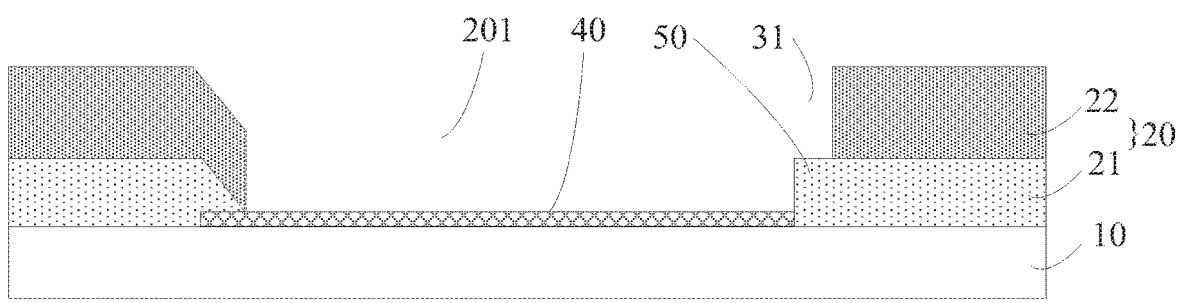

As shown in FIG. 25, the pixel defining layer 20 is formed by the first transparent insulating film layer 21 and the second transparent insulating film layer 22, and the sub-pixel opening 201 and the expansion groove 31 are formed on the pixel defining layer 20.

The second transparent insulating film layer 22 in the sub-pixel opening may be removed by a patterning process while forming an expansion groove 31 at the corner of the sub-pixel opening 201, the depth of the expansion groove 31 being the same as the thickness of the second transparent insulating film layer 22. Thus, an insulating layer 50 is formed at the bottom of the expansion groove 31, and the insulating layer 50 can separate the electrode 40 from the thin film formed of the organic material in the expansion groove 31, and can prevent light from being emitted through the film formed in the expansion groove 31 under action of the electrode 40.

It should be noted that FIGS. 23 to 25 are cross-sectional views of the display substrate corresponding to C-C in FIG. 6 during the manufacturing process.

Thus, after ink is dropped into the sub-pixel region, the film formed by the ink in the expansion groove is thinner, and the ink in the expansion groove dries faster, which can facilitate the flow of the ink into the expansion groove. In addition, the second transparent insulating film layer formed at the position corresponding to the expansion groove on the base substrate can separate the electrode from the film formed of the organic material in the expansion groove, so that it can prevent light from being emitted through the film formed in the expansion groove.

The above description is only the preferred arrangements of the present disclosure, and is not intended to limit the disclosure. Any modifications, equivalent substitutions, improvements, etc. within the spirit and principles of the present disclosure should fall in the protection scope of the present disclosure.

What is claimed is:

1. A display substrate, comprising:
a base substrate; and
a pixel defining layer disposed on the base substrate;
wherein the pixel defining layer divides the base substrate into a plurality of sub-pixel regions, an orthographic projection of at least one of the sub-pixel regions on the base substrate is approximately a quadrilateral, the quadrilateral comprises a first side, a second side, a third side and a fourth side connected sequentially end to end, the first side and the third side are disposed opposite to each other, the first side and the third side are recessed toward inside of the quadrilateral, and the second side and the fourth side are recessed toward inside of the quadrilateral.

2. The display substrate according to claim 1, wherein a perpendicular distance between the first side and a first line segment gradually increases and then gradually decreases in an extending direction of the first line segment, a perpendicular distance between the third side and a second line segment gradually increases and then gradually decreases in an extending direction of the second line segment; and
the first line segment is a line segment connecting two end points of the first side, and the second line segment is a line segment connecting two end points of the third side.

3. The display substrate according to claim 2, wherein a point on the first side to which a perpendicular distance from the first line segment is the largest is an intersection of a mid-perpendicular line of the first line segment with the first side, and a point on the third side to which a perpendicular distance from the second line segment is the largest is an intersection of a mid-perpendicular line of the second line segment with the third side.

4. The display substrate according to claim 1, wherein an orthographic projection of the sub-pixel region on the base substrate is a rectangle with a curved side.

5. The display substrate according to claim 1, wherein the pixel defining layer is provided with an expansion groove, the expansion groove is located at at least one corner of the sub-pixel region, and is in communication with the sub-pixel region.

6. The display substrate according to claim 5, wherein an orthographic projection of an inner sidewall of the expansion groove on the base substrate is a superior arc.

7. The display substrate according to claim 6, wherein a radius of the superior arc is ⅛ to 1/12 of a length of a shorter side of the sub-pixel region.

8. The display substrate according to claim 5, wherein an insulating layer is disposed at a bottom of the expansion groove.

9. The display substrate according to claim 8, wherein a difference between a thickness of the pixel defining layer and a depth of the expansion groove is 1000 angstroms to 2000 angstroms.

10. The display substrate according to claim 1, wherein a length of the first side and the third side is larger than a length of the second side and the fourth side.

11. The display substrate according to claim 10, wherein the first side and the third side are arc sides, and a circle height of the arc side is ⅛~1/12 of the length of the second side or the fourth side, where the circle height of the arc side is a difference between a radius of the arc side and a chord distance of a chord opposite to the arc side.

12. The display substrate according to claim 1, wherein the display substrate further comprises an electrode disposed between the base substrate and the pixel defining layer, and the orthographic projection of the sub-pixel region on the base substrate is within an orthographic projection of the electrode on the base substrate.

13. A display device comprising the display substrate according to claim 1.

14. A manufacturing method of a display substrate, comprising:
providing a base substrate; and
forming a pixel defining layer on the base substrate;
wherein the pixel defining layer divides the base substrate into a plurality of sub-pixel regions, an orthographic projection of at least one of the sub-pixel regions on the base substrate is approximately a quadrilateral, the quadrilateral comprises a first side, a second side, a third side and a fourth side connected sequentially end to end, the first side and the third side are disposed opposite to each other, the first side and the third side are recessed toward inside of the quadrilateral, and the second side and the fourth side are recessed toward inside of the quadrilateral.

15. The manufacturing method according to claim 14, wherein a perpendicular distance between the first side and a first line segment gradually increases and then gradually decreases in an extending direction of the first line segment, a perpendicular distance between the third side and a second line segment gradually increases and then gradually decreases in an extending direction of the second line segment; and
the first line segment is a line segment connecting two end points of the first side, and the second line segment is a line segment connecting two end points of the third side.

16. The manufacturing method according to claim 14, wherein forming a pixel defining layer on the base substrate comprises:
forming a transparent insulating film layer on the base substrate; and
forming a sub-pixel opening and an expansion groove on the transparent insulating film layer, wherein the expansion groove is located at one corner of the sub-pixel opening and is in communication with the sub-pixel opening.

17. The manufacturing method according to claim 14, wherein forming a pixel defining layer on the base substrate comprises:
forming a first transparent insulating film layer on the base substrate;
forming a sub-pixel opening on the first transparent insulating film layer;
forming a second transparent insulating film layer on the first transparent insulating film layer; and
forming the expansion groove on the second transparent insulating film layer.

\* \* \* \* \*